US012765176B2

(12) United States Patent
Cao

(10) Patent No.: US 12,765,176 B2
(45) Date of Patent: Oct. 13, 2026

(54) DISPLAY PANEL

(71) Applicant: Wuhan China Star Optoelectronics Semiconductor Display Technology Co., Ltd., Wuhan (CN)

(72) Inventor: Zuqiang Cao, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 1337 days.

(21) Appl. No.: 17/435,092

(22) PCT Filed: Aug. 3, 2021

(86) PCT No.: PCT/CN2021/110211
§ 371 (c)(1),
(2) Date: Jan. 19, 2023

(87) PCT Pub. No.: WO2023/284034
PCT Pub. Date: Jan. 19, 2023

(65) Prior Publication Data
US 2024/0023376 A1 Jan. 18, 2024

(30) Foreign Application Priority Data
Jul. 15, 2021 (CN) ........................ 202110798443.X

(51) Int. Cl.
*H10K 59/122* (2023.01)
*H10K 59/35* (2023.01)
*H10K 59/80* (2023.01)
*H10K 71/16* (2023.01)

(52) U.S. Cl.
CPC ......... *H10K 59/122* (2023.02); *H10K 59/353* (2023.02); *H10K 59/8723* (2023.02); *H10K 71/166* (2023.02)

(58) Field of Classification Search
CPC ............... H10K 59/122; H10K 59/353; H10K 59/8723; H10K 71/166; H10K 59/352; H10K 59/12; H10K 50/8428
See application file for complete search history.

(56) References Cited

U.S. PATENT DOCUMENTS

2017/0179420 A1 6/2017 Lee et al.
2023/0371336 A1* 11/2023 Wang .................. H10K 59/353

FOREIGN PATENT DOCUMENTS

| | | |
|---|---|---|
| CN | 104112824 | 10/2014 |
| CN | 107871774 | 4/2018 |
| CN | 108701708 | 10/2018 |
| CN | 110752243 | 2/2020 |
| CN | 110783481 | 2/2020 |

(Continued)

*Primary Examiner* — Steven B Gauthier
*Assistant Examiner* — Alvin L Lee

(57) ABSTRACT

The present application provides a display panel. The display panel includes a thin film transistor layer, a pixel definition layer, and a spacer layer. The pixel definition layer includes first sub-pixel openings for arranging first-color sub-pixels. The spacer layer includes first spacer pillars distributed according to a first preset rule. The first spacer pillars and the first sub-pixel openings adjacent to the first spacer pillars are arranged in one-to-one correspondence. The first sub-pixel openings are arranged in at least two directions around the first spacer pillars adjacent to the first sub-pixel openings.

12 Claims, 9 Drawing Sheets

(56) References Cited

FOREIGN PATENT DOCUMENTS

| | | |
|---|---|---|
| CN | 110890397 | 3/2020 |
| CN | 111613636 | 9/2020 |
| CN | 112313801 | 2/2021 |
| CN | 112420966 | 2/2021 |
| JP | 11-214154 | 8/1999 |

* cited by examiner

DISPLAY PANEL

RELATED APPLICATIONS

This application is a National Phase of PCT Patent Application No. PCT/CN2021/110211 having International filing date of Aug. 3, 2021, which claims the benefit of priority of Chinese Patent Application No. 202110798443.X filed on Jul. 15, 2021. The contents of the above applications are all incorporated by reference as if fully set forth herein in their entirety.

FIELD AND BACKGROUND OF THE INVENTION

The present application relates to a field of display technology and in particular, to a display panel.

Organic light-emitting diodes (OLEDs) are extensively used due to the advantages of high luminous efficiency and fast response speed. As shown in FIGS. 1 to 2, manufacturing of an OLED display panel mainly comprises sequentially forming an array substrate 110, a pixel definition layer 120, spacer pillars 130, a light-emitting functional film layer 140, an encapsulation layer, etc. In a process of forming the light-emitting functional film layer 140 in pixel openings of the pixel definition film layer 120, a mask structure such as a fine metal mask 150 (FMM) is attached to the spacer pillars 130, so that the spacer pillars 130 can support the fine metal mask 150, and then a light-emitting functional material is deposited by evaporation deposition.

Technical Problem

At present, misalignment easily occurs during a process of attaching the fine metal mask 150 to the spacer pillars 130 or detaching the fine metal mask 150 from the spacer pillars 130, so that the spacer pillars 130 slide down to openings of the fine metal mask 150, causing the spacer pillars 130 to be scratched by the fine metal mask 150 to generate fine particles, which leads to cracking of a subsequently produced encapsulation layer and encapsulation failures, even causes an organic light-emitting layer to fail and results in display abnormality of the OLED display panel.

SUMMARY OF THE INVENTION

The present application provides a display panel to solve a technical problem that spacer pillars of conventional display panel easily slide into openings of a mask and get scratched.

The present application provides a display panel, comprising:

a thin film transistor (TFT) layer;

a pixel definition layer disposed at one side of the TFT layer, the pixel definition layer comprising a plurality of sub-pixel openings, the sub-pixel openings comprising a plurality of first sub-pixel openings for disposing first-color sub-pixels; and a spacer layer arranged at one side of the pixel definition layer away from the TFT layer, the spacer layer comprising a plurality of first spacer pillars distributed according to a first preset rule;

wherein the first spacer pillars and the first sub-pixel openings adjacent to the first spacer pillars are arranged in one-to-one correspondence, and the first sub-pixel openings are arranged in at least two directions around the first spacer pillars adjacent to the first sub-pixel openings.

In the display panel according to one embodiment of the present application, the first spacer pillars comprise a plurality of first sub-spacers and a plurality of second sub-spacers;

in an adjacent couple of the first sub-spacers and the second sub-spacers, the first sub-spacer is arranged at one side of the adjacent first sub-pixel opening toward a first direction, the second sub-spacer is arranged at one side of the adjacent first sub-pixel opening toward a second direction, and the second direction forms a first predetermined included angle with the first direction.

In the display panel according to one embodiment of the present application, the first predetermined included angle is 180 degrees.

In the display panel according to one embodiment of the present application, the sub-pixel openings further comprise a plurality of second sub-pixel openings for disposing second-color sub-pixels, and the first-color sub-pixels and the second-color sub-pixels display different colors; and the first spacer pillars and the second sub-pixel openings adjacent to the first spacer pillars are arranged in one-to-one correspondence, and the second sub-pixel openings are arranged in at least two directions around the first spacer pillars adjacent to the second sub-pixel openings.

In the display panel according to one embodiment of the present application, in an adjacent couple of the first sub-spacers and the second sub-spacers, the first sub-spacer is disposed at one side of the adjacent second sub-pixel opening toward a third direction, the second sub-spacer is arranged at one side of the adjacent second sub-pixel opening toward a fourth direction, and the third direction forms a second predetermined included angle with the fourth direction.

In the display panel according to one embodiment of the present application, the second predetermined included angle is 180 degrees.

In the display panel according to one embodiment of the present application, each of the first spacer pillars is disposed between the adjacent first sub-pixel opening and the adjacent second sub-pixel opening, the first direction is opposite to the third direction, and the second direction is opposite to the fourth direction.

In the display panel according to one embodiment of the present application, the first-color sub-pixels are blue sub-pixels or red sub-pixels, and the second-color sub-pixels are blue sub-pixels or red sub-pixels.

In the display panel according to one embodiment of the present application, the first spacer pillars comprise a plurality of first spacer sets and a plurality of second spacer sets; each of the first spacer sets comprises multiple adjacent ones of the first sub-spacers; each of the second spacer sets comprises multiple adjacent ones of the second sub-spacers; and the first spacer sets and the second spacer sets are alternately arranged.

In the display panel according to one embodiment of the present application, the spacer layer comprises a plurality of second spacer pillars distributed according to a second preset rule;

the second spacer pillars and the first sub-pixel openings adjacent to the second spacer pillars are arranged in one-to-one correspondence, and the second spacer pillars and the first spacer pillars adjacent to the second spacer pillars are arranged in one-to-one correspondence; and the first sub-pixel openings are arranged in at least two directions around the first spacer pillars adjacent to the first sub-pixel openings, and the first sub-pixel openings are arranged in at least two directions around the second spacer pillars adjacent to the first sub-pixel openings.

In the display panel according to one embodiment of the present application, the second spacer pillars comprise a plurality of third sub-spacers and a plurality of fourth sub-spacers; and in an adjacent couple of the third sub-spacers and the fourth sub-spacers, the third sub-spacer pillar is arranged at one side of the adjacent first sub-pixel opening toward a fifth direction, the fourth sub-spacer is arranged at one side of the adjacent first sub-pixel opening toward a sixth direction, and the fifth direction forms a third predetermined included angle with the sixth direction.

In the display panel according to one embodiment of the present application, in the first sub-spacer and the third sub-spacer adjacent to the same first sub-pixel opening, a fourth predetermined included angle between the first direction and the fifth direction is less than 180 degrees; and in the second sub-spacer and the fourth sub-spacer adjacent to the same first sub-pixel opening, a fifth predetermined included angle between the second direction and the sixth direction is less than 180 degrees.

In the display panel according to one embodiment of the present application, the fourth predetermined included angle and the fifth predetermined included angle are both 90 degrees.

The present application provides a display panel, comprising:

a thin film transistor (TFT) layer;

a pixel definition layer disposed at one side of the TFT layer, the pixel definition layer comprising a plurality of sub-pixel openings, the sub-pixel openings comprising a plurality of first sub-pixel openings for disposing first-color sub-pixels; and a spacer layer arranged at one side of the pixel definition layer away from the TFT layer, the spacer layer comprising a plurality of first spacer pillars distributed according to a first preset rule;

wherein the first spacer pillars and the first sub-pixel openings adjacent to the first spacer pillars are arranged in one-to-one correspondence, and the first sub-pixel openings are arranged in at least two directions around the first spacer pillars adjacent to the first sub-pixel openings;

the first spacer pillars comprise a plurality of first sub-spacers and a plurality of second sub-spacers;

in an adjacent couple of the first sub-spacers and the second sub-spacers, the first sub-spacer is arranged at one side of the adjacent first sub-pixel opening toward a first direction, the second sub-spacer is arranged at one side of the adjacent first sub-pixel opening toward a second direction, and the second direction forms a first predetermined included angle with the first direction;

the spacer layer comprises a plurality of second spacer pillars distributed according to a second preset rule;

the second spacer pillars and the first sub-pixel openings adjacent to the second spacer pillars are arranged in one-to-one correspondence, and the second spacer pillars and the first spacer pillars adjacent to the second spacer pillars are arranged in one-to-one correspondence; and the first sub-pixel openings are arranged in at least two directions around the first spacer pillars adjacent to the first sub-pixel openings, and the first sub-pixel openings are arranged in at least two directions around the second spacer pillars adjacent to the first sub-pixel openings.

In the display panel according to one embodiment of the present application, the sub-pixel openings further comprise a plurality of second sub-pixel openings for disposing second-color sub-pixels, and the first-color sub-pixels and the second-color sub-pixels display different colors; and the first spacer pillars and the second sub-pixel openings adjacent to the first spacer pillars are arranged in one-to-one correspondence, and the second sub-pixel openings are arranged in at least two directions around the first spacer pillars adjacent to the second sub-pixel openings.

In the display panel according to one embodiment of the present application, in an adjacent couple of the first sub-spacers and the second sub-spacers, the first sub-spacer is disposed at one side of the adjacent second sub-pixel opening toward a third direction, the second sub-spacer is arranged at one side of the adjacent second sub-pixel opening toward a fourth direction, and the third direction forms a second predetermined included angle with the fourth direction.

In the display panel according to one embodiment of the present application, each of the first spacer pillars is disposed between the adjacent first sub-pixel opening and the adjacent second sub-pixel opening, the first direction is opposite to the third direction, and the second direction is opposite to the fourth direction.

In the display panel according to one embodiment of the present application, the first-color sub-pixels are blue sub-pixels or red sub-pixels, and the second-color sub-pixels are blue sub-pixels or red sub-pixels.

In the display panel according to one embodiment of the present application, the first spacer pillars comprise a plurality of first spacer sets and a plurality of second spacer sets; each of the first spacer sets comprises multiple adjacent ones of the first sub-spacers; each of the second spacer sets comprises multiple adjacent ones of the second sub-spacers; and the first spacer sets and the second spacer sets are alternately arranged.

In the display panel according to one embodiment of the present application, the second spacer pillars comprise a plurality of third sub-spacers and a plurality of fourth sub-spacers; and in an adjacent couple of the third sub-spacers and the fourth sub-spacers, the third sub-spacer pillar is arranged at one side of the adjacent first sub-pixel opening toward a fifth direction, the fourth sub-spacer is arranged at one side of the adjacent first sub-pixel opening toward a sixth direction, and the fifth direction forms a third predetermined included angle with the sixth direction.

Advantages of the Present Application

Advantages of the present application: in the present application, multiple first spacer pillars are distributed according to the first preset rule, so that the first spacer pillars and the first sub-pixel openings adjacent to the first spacer pillars are arranged in one-to-one correspondence, and the first sub-pixel openings are arranged in at least two directions around the first spacer pillars adjacent to the first sub-pixel openings. That is to say, the first spacer pillars are arranged in different directions with respect to the first sub-pixel openings. Since the pixel openings correspond in position to the openings of the mask, the first spacer pillars 41 are prevented from all sliding into the openings of the mask at the same time when the mask is misaligned. When one of the spacer pillars slides into the opening of the mask, another spacer pillar can provide a support function, so as to prevent the spacer pillar sliding into the opening of the mask from being scratched, thereby reducing a risk of producing fine particles and preventing encapsulation failures or display abnormality of the display panel.

BRIEF DESCRIPTION OF THE SEVERAL VIEWS OF THE DRAWINGS

In order to more clearly illustrate the embodiments of the present disclosure or related art, figures which will be described in the embodiments are briefly introduced hereinafter. It is obvious that the drawings are merely for the purposes of illustrating some embodiments of the present disclosure, and a person having ordinary skill in this field can obtain other figures according to these figures without inventive work.

DESCRIPTION OF SPECIFIC EMBODIMENTS OF THE INVENTION

Figure 1:
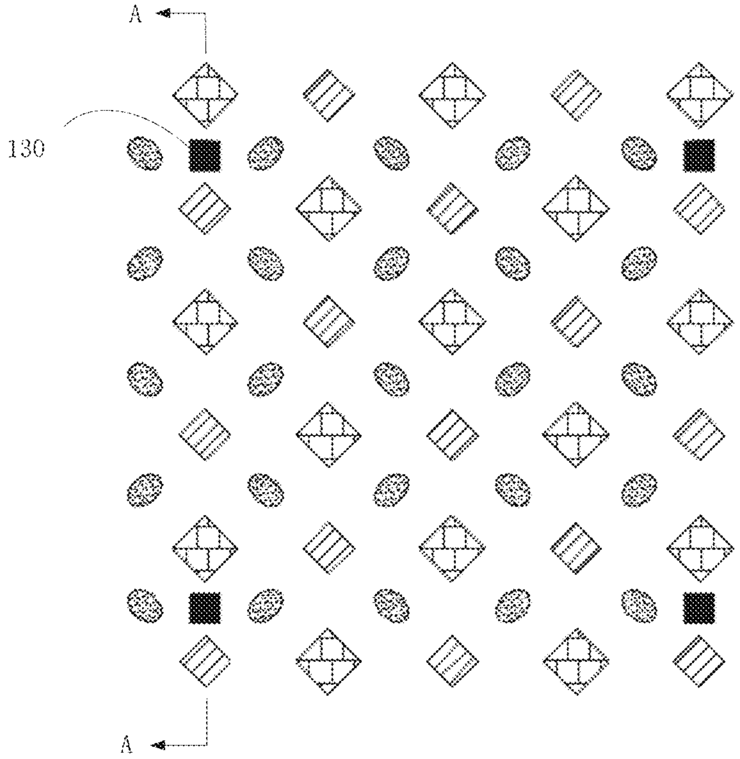
Prior Art FIG. 1
FIG. 1 is a top view of a conventional display panel.

The present invention is illustrated with reference to the accompanying drawings and in conjunction with specific embodiments. The directional terms mentioned in the present invention, such as “up”, “down”, “front”, “rear”, “left”, “right”, “inside”, “outside”, and “lateral”, are for illustrative purposes based on the directions of the accompanying drawings. Therefore, the directional terms are used for illustrative purposes and for ease of understanding the present invention, rather than limiting the present invention. In the drawings, structurally similar structures are indicated by the same reference numerals.

In the description of the present application, it should be understood that the terms “first” and “second” are only used for illustrative purposes, and cannot be understood as indicating or implying relative importance or implicitly indicating the number of indicated technical features. Therefore, the features defined with “first” and “second” can explicitly or implicitly include one or more of the features. In the description of the present application, “multiple” means two or more than two, unless otherwise specifically defined.

In the description of the present application, it should be noted that the terms “installed”, “connected” and “coupled” should be interpreted broadly unless otherwise clearly specified and defined. For example, elements can be a fixedly connected or detachably connected. Elements can be mechanically connected or electrically connected, or can communicate with each other. Elements can be directly connected, or indirectly connected through an intermediate medium. Two elements can communicate each other by their inner spaces or can interact with each other. For those of ordinary skill in the art, specific meanings of the above-mentioned terms in the present application can be understood on a case-by-case basis.

The technical solution of the present application will now be described in conjunction with specific embodiments.

Figure 3:
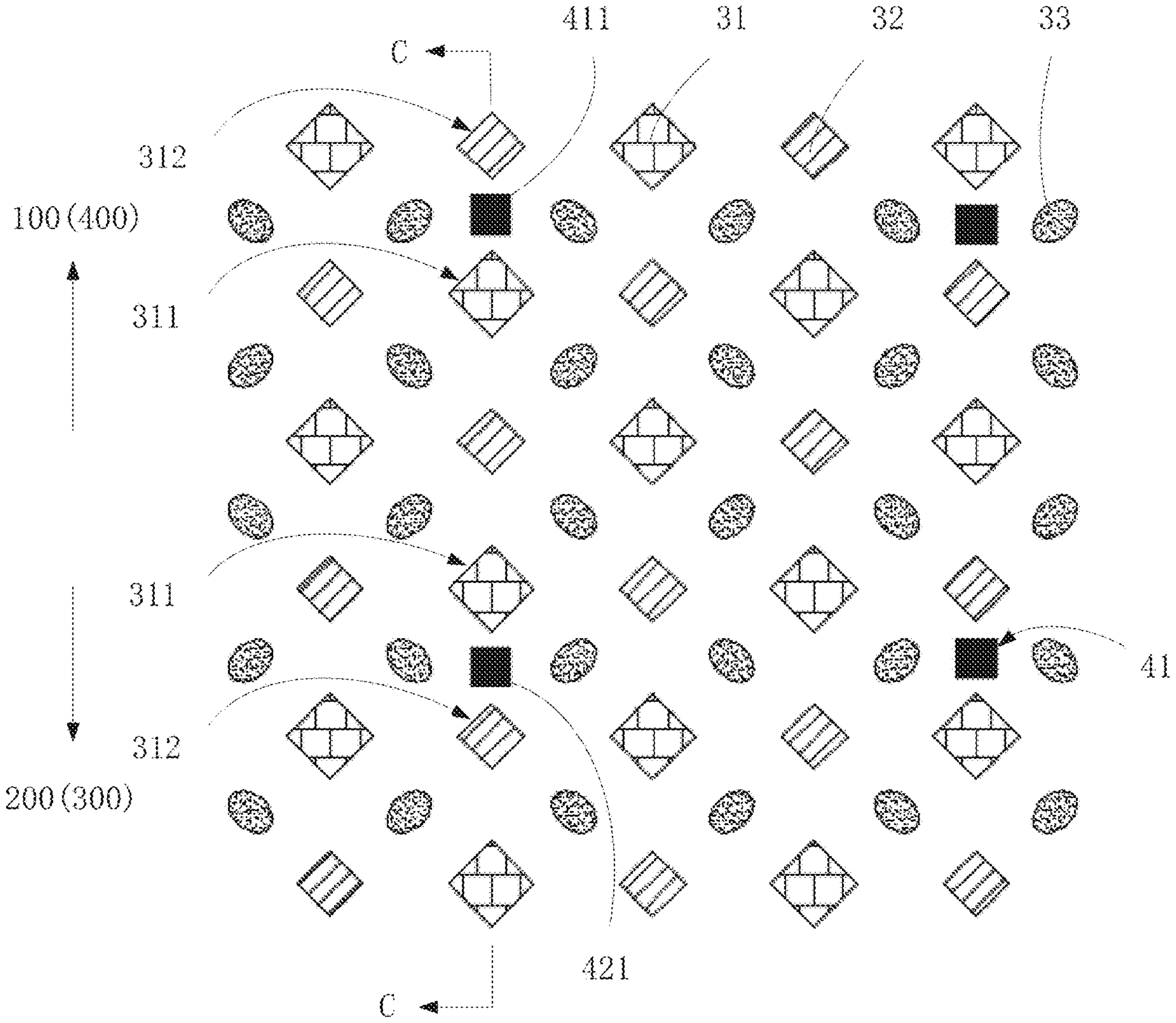
FIG. 3 is a schematic structural view illustrating a display panel according to a first embodiment of the application.
Figure 4:
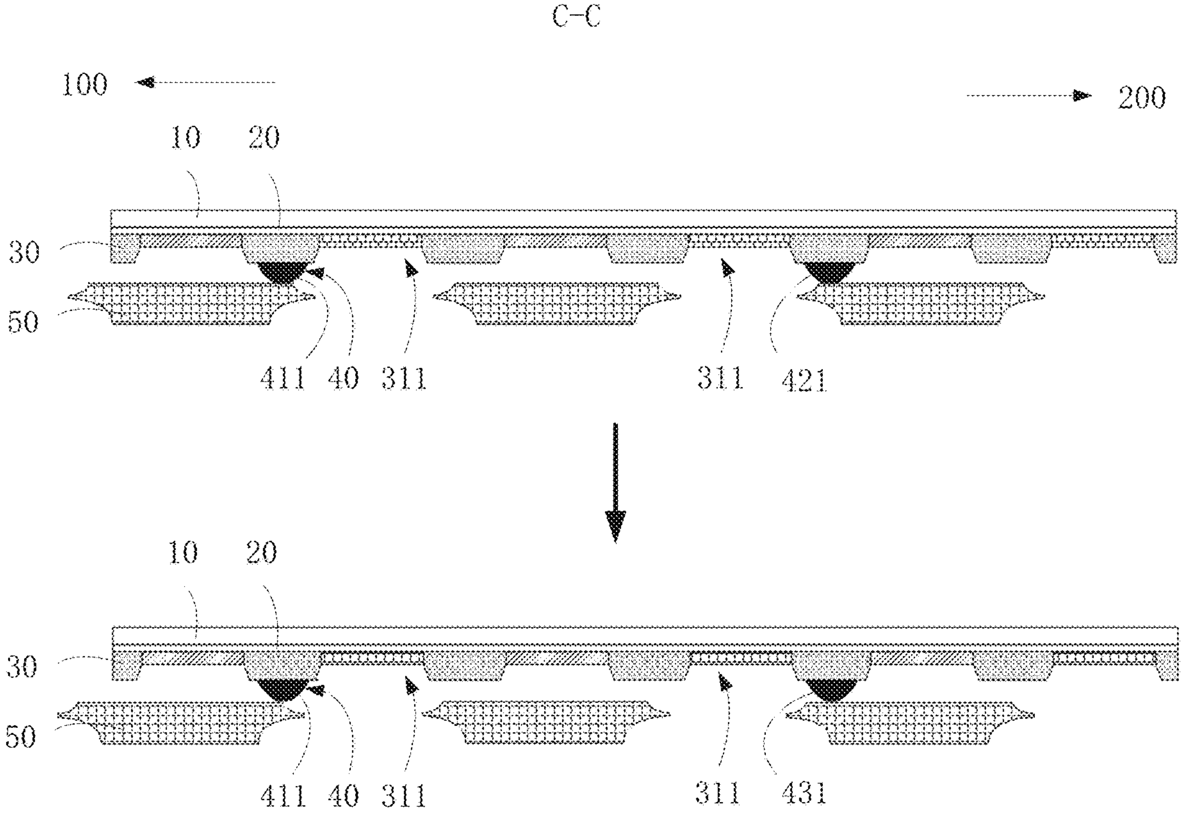
FIG. 4 is a schematic cross-sectional structural view, taken along line C-C in FIG. 3, illustrating a misalignment process of a first mask.

Referring to FIGS. 3 to 4, the present application provides a display panel, comprising:

a thin film transistor (TFT) layer 20;

a pixel definition layer 30 disposed at one side of the TFT layer 20, the pixel definition layer 30 comprising a plurality of sub-pixel openings, and the sub-pixel openings comprising a plurality of first sub-pixel openings 311 for disposing first-color sub-pixels 31; and a spacer layer 40 arranged at one side of the pixel definition layer 30 away from the TFT layer 20, the spacer layer 40 comprising a plurality of first spacer pillars 41 distributed according to a first preset rule;

wherein the first spacer pillars 41 and the first sub-pixel openings 311 adjacent to the first spacer pillars 41 are arranged in one-to-one correspondence, and the first sub-pixel openings 311 are arranged in at least two directions around the first spacer pillars 41 adjacent to the first sub-pixel openings 311.

Figure 2:
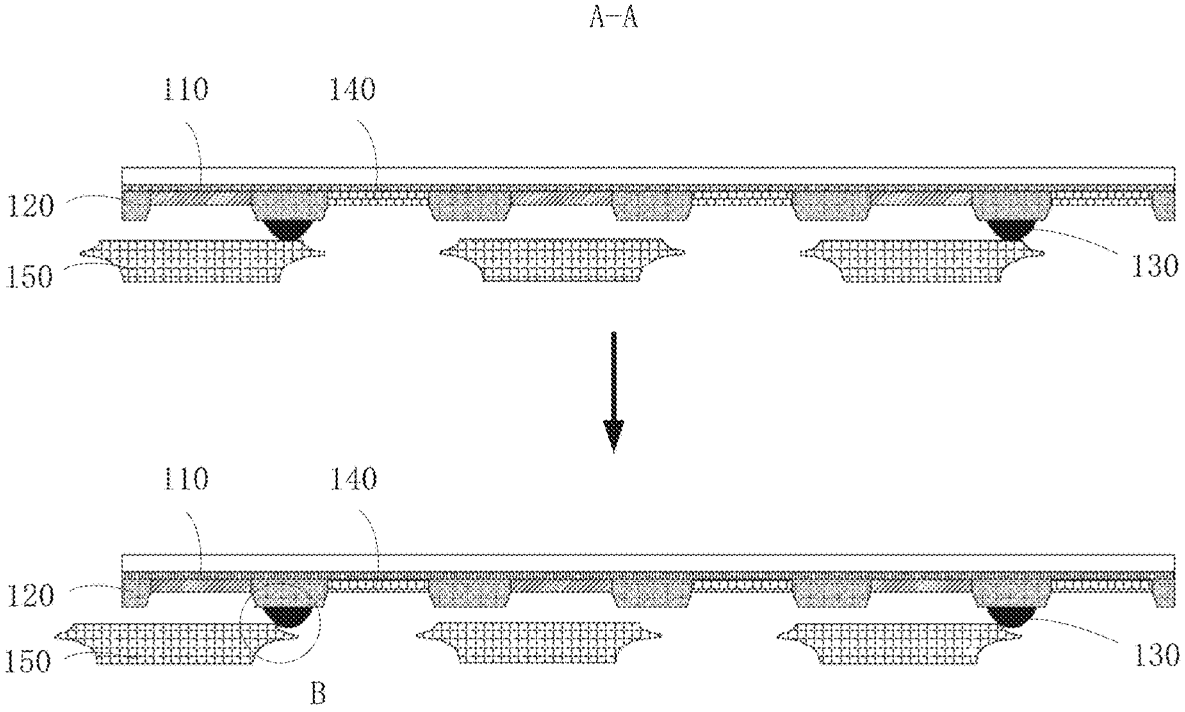
Prior Art FIG. 2
FIG. 2 is a schematic cross-sectional structural view, taken along line A-A in FIG. 1, illustrating a misalignment process of a fine metal mask.

It can be understood that, as shown in FIGS. 1 to 2, in a process of vapor depositing a luminescent functional material in pixel openings, it is necessary to attach a mask structure such as a fine metal mask 150 (FMM) to spacer pillars 130, so that the spacer pillars 130 can support the fine metal mask 150. At present, it is easy to cause misalignment during a process of attaching the fine metal mask 150 to the spacer pillars 130, so that each spacer pillar 130 slides down to opening of the fine metal mask 150, and thus the spacer pillars 130 are scratched by the fine metal mask 150 to produce fine particles. This causes a subsequently produced encapsulation layer to crack, which leads to encapsulation failures and even failures of the luminescent functional material to cause display abnormality of an OLED display panel. As shown in FIG. 2, when the fine metal mask 150 is misaligned, the spacer pillars 130 are scratched by the fine metal mask 150 at position B in FIG. 2. However, in the present application, the first spacer pillars 41 are distributed according to a first preset rule, so that the first spacer pillars 41 and the first sub-pixel openings 311 adjacent to the first spacer pillars are arranged in one-to-one correspondence, and the first sub-pixel openings 311 are arranged in at least two directions around the first spacer pillars 41 adjacent to the first sub-pixel openings 311. That is to say, the first spacer pillars 41 are arranged in different directions with respect to the first sub-pixel openings 311. Since the pixel openings correspond in position to the openings of the mask, the first spacer pillars 41 are prevented from all sliding into openings of a mask at the same time when the mask is misaligned. When one of the spacer pillars slides into the openings of the mask, another spacer pillar can provide a support function, so as to prevent the spacer pillar sliding into the opening of the mask from being scratched, thereby reducing a risk of producing fine particles, and preventing encapsulation failures or display abnormality of the display panel.

Figure 5:
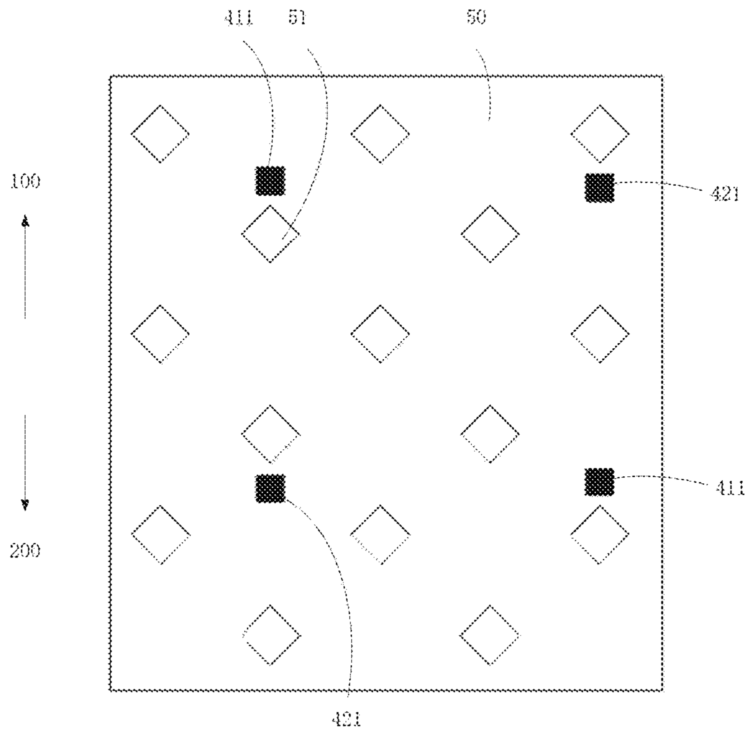
FIG. 5 is a schematic structural view illustrating relative positions of the first mask, first sub-spacers, and second sub-spacers when alignment of the first mask is correct.
Figure 6:
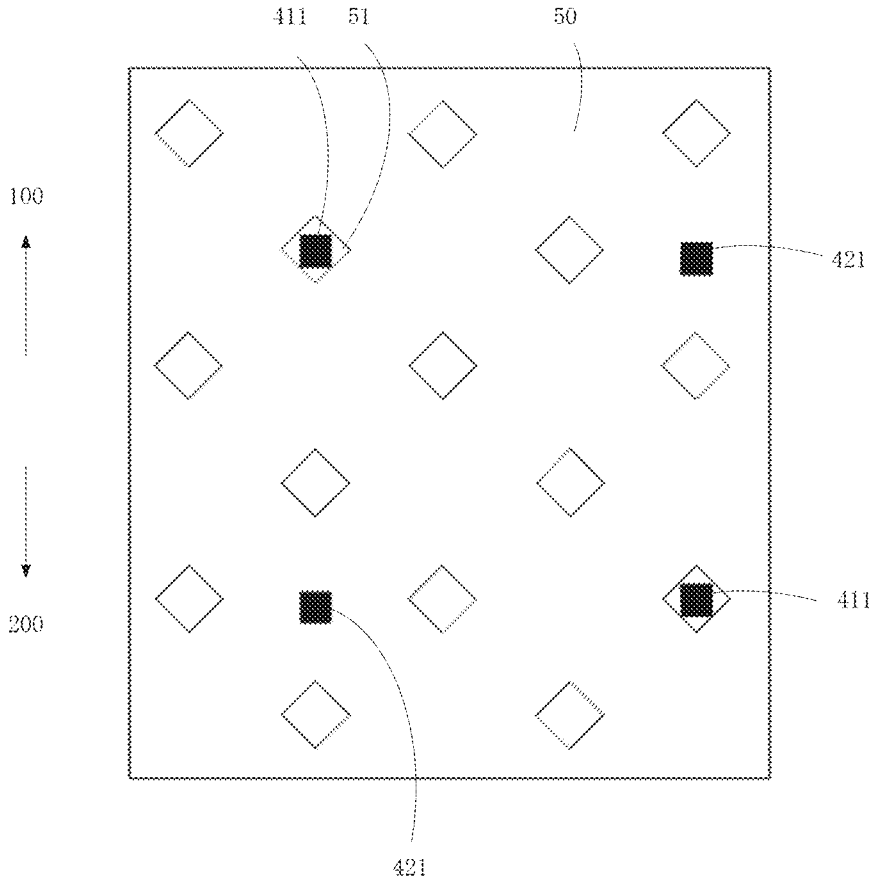
FIG. 6 is a schematic structural view showing relative positions of the first mask, the first sub-spacers, and the second sub-spacers after the first mask is shifted and misaligned in a first direction.

It should be noted that the display panel further comprises an organic light-emitting layer disposed in the sub-pixel openings, and an encapsulation layer disposed on the organic light-emitting layer and the spacer layer 40. A substrate 10 is disposed at one side of the TFT layer 20 away from the pixel definition layer 30. In the display panel, the sub-pixel openings can comprise a plurality of first sub-pixel openings 311 for disposing first-color sub-pixels 31, a plurality of second sub-pixel openings 312 for disposing second-color sub-pixels 32, and a plurality of third sub-pixel openings 313 for disposing third color sub-pixels 33. To form the organic light-emitting layer, an organic light-emitting material is vapor deposited in the first sub-pixel openings 311, the second sub-pixel openings 312, and the third sub-pixel openings 313. Certainly, different masks are used to vapor deposit the organic light-emitting material in the sub-pixel openings displaying different colors. Specifically, as shown in FIGS. 4 to 6, when the organic light-emitting material is vapor-deposited in each of the first sub-pixel openings 311, a first mask 50 that matches with the first sub-pixel openings 311 is used. The first mask 50 comprises a plurality of first openings 51 matching a shape and a size of each of the first sub-pixel openings 311.

It should be noted that the spacer layer 40 comprises a plurality of first spacer pillars 41 distributed according to the first preset rule, and the first spacer pillars 41 and the first sub-pixel openings 311 adjacent to the first spacer pillars 41 are arranged in one-to-one correspondence. The first sub-pixel openings 311 are arranged in at least two directions around the first spacer pillars 41 adjacent to the first sub-pixel openings 311. In an adjacent couple of the first spacer pillars 41 and the first sub-pixel openings 311, a distance from the first spacer pillar 41 to the first sub-pixel opening 311 is less than or equal to a distance from any one of the first spacer pillars 41 to the first sub-pixel opening 311. Furthermore, under a precondition that the first sub-pixel openings 311 are arranged in at least two directions around the first spacer pillars 41 adjacent to the first sub-pixel openings 311, the first spacer pillars 41 are arranged according to the first preset rule, and the first spacer pillars 41 can be arranged in a regular arrangement such as a matrix, or arranged in an irregular arrangement.

In one embodiment, the first spacer pillars 41 comprise a plurality of first sub-spacers 411 and a plurality of second sub-spacers 421. In an adjacent couple of the first sub-spacers 411 and the second sub-spacers 421, the first sub-spacer 411 is arranged at one side of the adjacent first sub-pixel opening 311 toward a first direction 100, the second sub-spacer 421 is arranged at one side of the adjacent first sub-pixel opening 311 toward a second direction 200, and the second direction 200 forms a first predetermined included angle with the first direction 100.

The first sub-spacer 411 is disposed at one side of the adjacent first sub-pixel opening 311 toward the first direction 100, and the second sub-spacer 421 is disposed at one side of the adjacent first sub-pixel opening 311 toward the second direction 200. The second direction 200 forms the first predetermined included angle with the first direction 100. That is to say, the first sub-spacer 411 and the second sub-spacer 421 are arranged in different directions around the corresponding first sub-pixel openings 311. A distance from the first sub-spacer 411 to the adjacent sub-pixel opening 311 is less than or equal to a distance from any of the first spacer pillars 41 to the said first sub-pixel opening 311. Similarly, a distance from the second sub-spacer 421 to the adjacent first sub-pixel opening 311 is less than or equal to a distance from any one of the first spacer pillars 41 to the said first sub-pixel opening 311.

In the present embodiment, as shown in FIGS. 3 to 6, when the first mask 50 is misaligned, the first sub-spacer 411 is disposed at one side of the adjacent first sub-pixel opening 311 toward the first direction 100, the second sub-spacer 421 is disposed at one side of the adjacent first sub-pixel opening 311 toward the second direction 200, thereby preventing the first sub-spacer 411 and the second sub-spacer 421 from sliding into the first openings 51 of the first mask 50 at the same time, thus preventing the first sub-spacer 411 and the second sub-spacer 421 from being scratched to generate particles. Accordingly, the present application prevents encapsulation failures or display abnormality of the display panel. Specifically, the first predetermined included angle can be 180 degrees, that is, the first direction 100 is opposite to the second direction 200.

To sum up, specifically, as shown in FIGS. 4 to 6, when the first mask 50 is misaligned toward the first direction 100, it is easy to cause the first sub-spacers 411 to slide into the first openings 51. At this point, because each of the second sub-spacers 421 can better support the first mask 50, the first sub-spacers 411 sliding into the first openings 51 are prevented from being scratched. When the first mask 50 is misaligned toward the second direction 200, it is easy to cause the second sub-spacers 421 to slide into the first openings 51. At this point, because each of the first spacers 411 can better support the first mask 50, the second spacers 421 sliding into the first openings 51 are prevented from being scratched.

In one embodiment, as shown in FIG. 3, the sub-pixel openings further comprise multiple second sub-pixel openings 312 for disposing the second-color sub-pixels 32. The first-color sub-pixels 31 and the second-color sub-pixels 32 display different colors.

The first spacers 41 and the second sub-pixel openings 312 adjacent to the first spacers 41 are arranged in one-to-one correspondence. The second sub-pixel openings 312 are arranged in at least two directions around the first spacer pillars 41 adjacent to the second sub-pixel openings 312.

It should be noted that when the organic light-emitting material is vapor-deposited in each of the second sub-pixel openings 312, a second mask that matches each of the second sub-pixel openings 312 is used. The second mask comprises a plurality of second openings matching a shape and a size of each of the second sub-pixel openings 312. By distributing the first spacer pillars 41 according to the first preset rule, the first spacer pillars 41 and the second sub-pixel openings 312 adjacent to the first spacer pillars 41 are arranged in one-to-one correspondence, and the second sub-pixel openings 312 are arranged in at least two directions around the first spacer pillars 41 adjacent to the second sub-pixel openings 312. In other words, the first spacer pillars 41 are arranged in different directions with respect to the second sub-pixel openings 312. Since the second sub-pixel openings 312 correspond in position to the second openings of the second mask, the first spacer pillars 41 are prevented from all sliding into the second openings at the same time when the second mask is misaligned. When one of the first spacer pillars 41 slides into the second opening of the second mask, another first spacer pillar 41 can provide a support function, so as to prevent the first spacer pillar 41 sliding into the second opening from being scratched, thus reducing a risk of generating fine particles and preventing encapsulation failures and display abnormality of the display panel.

In the present embodiment, as shown in FIG. 3, in an adjacent couple of the first sub-spacers 411 and the second sub-spacers 421, the first sub-spacer 411 is disposed at one side of the adjacent second sub-pixel opening 312 toward a third direction 300, and the second sub-spacer 421 is disposed at one side of the adjacent second sub-pixel opening 312 toward a fourth direction 400. On the other hand, the third direction 300 forms a second predetermined included angle with the fourth direction 400.

The first sub-spacer 411 is disposed at one side of the adjacent second sub-pixel opening 312 toward the third direction 300, the second sub-spacer 421 is disposed at one side of the adjacent second sub-pixel opening 312 toward the fourth direction 400, and the third direction 300 forms the second predetermined included angle with the fourth direction 400. That is to say, the first sub-spacer 411 and the second sub-spacer 421 are arranged in different directions around the corresponding second sub-pixel openings 312. A distance from the first sub-spacer 411 to the adjacent second sub-pixel opening 312 is less than or equal to a distance from any one of the first spacer pillars 41 to the said second sub-pixel opening 312. Similarly, a distance from the second sub-spacer 421 to the adjacent second sub-pixel opening 312 is less than or equal to a distance from any one of the first spacer pillars 41 to the said second sub-pixel opening 312.

In the present embodiment, when the second mask is misaligned, the first sub-spacer 411 is disposed at one side of the adjacent second sub-pixel opening 312 toward the third direction 300, and the second sub-spacer 421 is arranged at one side of the adjacent second sub-pixel opening 312 toward the fourth direction 400, thus preventing the first sub-spacer 411 and the second sub-spacer 421 from both sliding into the second openings of the second mask at the same time, so as to prevent the first sub-spacer 411 and the second sub-spacer 421 from being scratched and generating particles, thereby preventing encapsulation failures or display abnormality of the display panel.

To sum up, specifically, when the second mask is misaligned toward the third direction 300, it is easy to cause the first sub-spacers 411 to slide into the second openings. At this point, because each of the second sub-spacers 421 can better support the second mask, the first sub-spacers 411 sliding into the second openings are prevented from being scratched. When the first mask 50 is misaligned toward the fourth direction 400, it is easy to cause the second sub-spacers 421 to slide into the first openings 51. At this point, each of the first sub-spacers 411 can better support the second mask, and prevents the second sub-spacers 421 sliding into the second openings from being scratched. In the present embodiment, the second predetermined included angle can be 180 degrees, that is, the third direction 300 can be opposite to the fourth direction 400. In detail, as shown in FIG. 3, the first spacer 41 is disposed between the first sub-pixel opening 311 and the second sub-pixel opening 312 adjacent to each other, the first direction 100 is opposite to the third direction 300, and the second direction 200 is opposite to the fourth direction 400.

In one embodiment, as shown in FIG. 3, the first-color sub-pixels 31 are blue sub-pixels or red sub-pixels, and the second-color sub-pixels 32 are blue sub-pixels or red sub-pixels. Certainly, the display panel displays blue at positions of blue sub-pixel openings, and displays red at positions of red sub-pixel openings. Specifically, the first sub-pixel openings 311 can be the blue sub-pixel openings. The second sub-pixel openings 312 can be the red sub-pixel openings. In addition, the third sub-pixel openings 313 can be green sub-pixel openings.

It can be understood that the sub-pixel openings which display different colors at corresponding positions do not have a same opening area. In the present embodiment, the sub-pixel openings arranged in order from largest to smallest in opening area are the blue sub-pixel openings, the red sub-pixel openings, and the green sub-pixel openings. Certainly, the larger the opening area of the sub-pixel opening, the greater the probability that the spacer pillar will slide into the sub-pixel opening. Specifically, as also described in the foregoing embodiment, the first sub-spacer 411 is disposed at one side of the adjacent first sub-pixel opening 311 toward the first direction 100, and the second sub-spacer 421 is disposed at one side of the adjacent first sub-pixel opening 311 toward the second direction 200. The first sub-spacer 411 is disposed at one side of the adjacent second sub-pixel opening 312 toward the third direction 300, and the second sub-spacer 421 is disposed at one side of the adjacent second sub-pixel opening 312 toward the fourth direction 400. The first sub-pixel openings 311 are configured to be blue sub-pixel openings, and the second sub-pixel openings 312 are configured to be red sub-pixel openings, thus preventing the first sub-spacer 411 and the second sub-spacer 421 from sliding into the blue sub-pixel openings at the same time, and also preventing the first sub-spacer 411 and the second sub-spacer 421 from sliding into the red sub-pixel openings at the same time. Accordingly, the present application reduces to the greatest extent a risk of scratching the first sub-spacers 411 and the second sub-spacers 421, and thereby prevents encapsulation failures or display abnormality of the display panel to the greatest extent.

Figure 7:
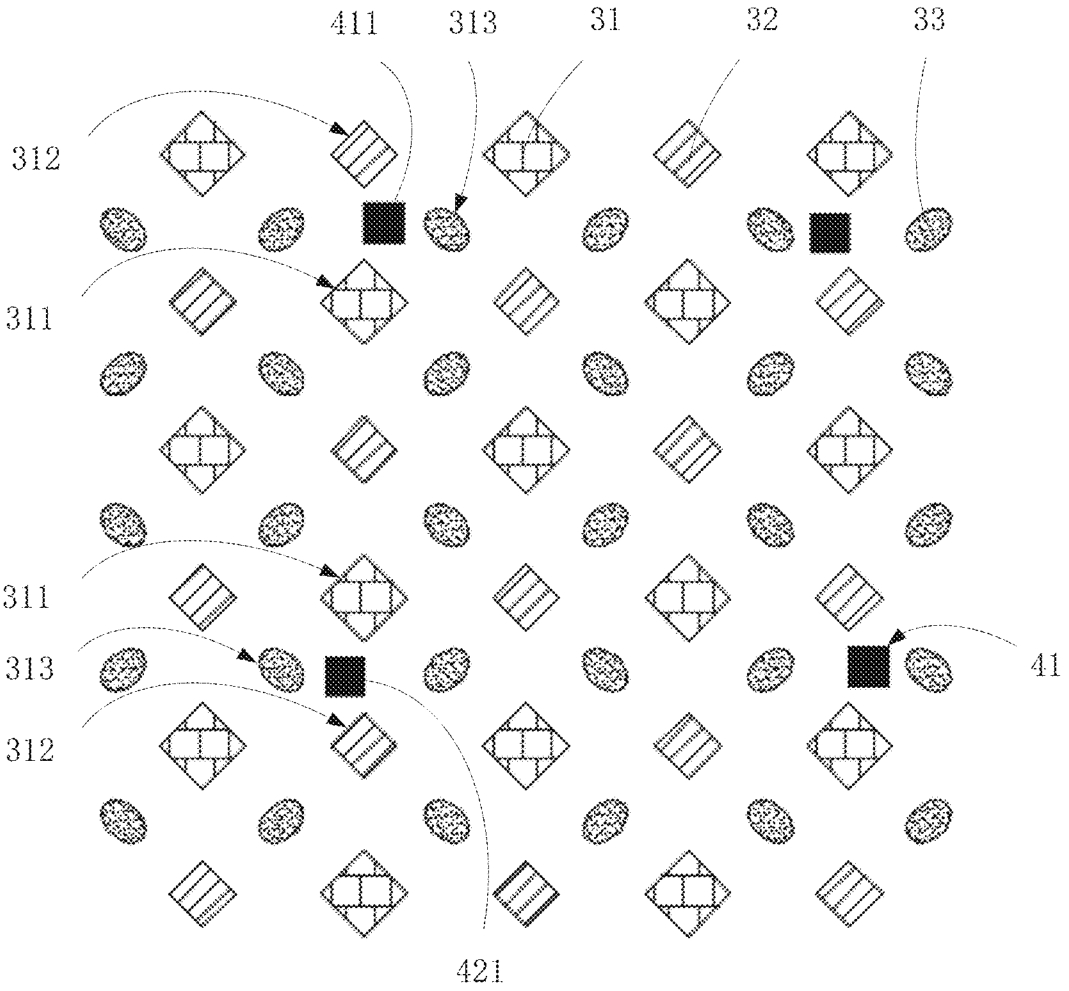
FIG. 7 is a schematic structural view illustrating the display panel according to a second embodiment of the present application.

In one embodiment, as shown in FIG. 7, the sub-pixel openings further comprise a plurality of third sub-pixel openings 313 for disposing third-color sub-pixels 33. The third-color sub-pixels 33, the second-color sub-pixels 32, and the first-color sub-pixels 31 display different colors. The first spacer pillars 41 and the third sub-pixel openings 313 adjacent to the first spacer pillars 41 are arranged in one-to-one correspondence, and the third sub-pixel openings 313 are disposed in at least two directions around the first spacer pillars 41 adjacent to the third sub-pixel openings 313.

It can be understood that when the organic light-emitting material is vapor-deposited in each of the third sub-pixel openings 313, a third mask that matches each of the third sub-pixel openings 313 is used, and the third mask comprises a plurality of third openings matching a shape and a size of each of the third sub-pixel openings 313. The first spacer pillars 41 are arranged according to the first preset rule, and the first spacer pillars 41 and the third sub-pixel openings 313 adjacent to the first spacer pillars 41 are arranged in one-to-one correspondence. The third sub-pixel openings 313 are arranged in at least two directions around the first spacer pillars 41 adjacent to the third sub-pixel openings 313. That is to say, the first spacer pillars 41 are arranged in different directions with respect to the third sub-pixel openings 313. Since the third sub-pixel openings 313 correspond in position to the third openings of the third mask, the first spacer pillars 41 are prevented from all sliding into the third openings at the same time when the third mask is misaligned. When one of the first spacer pillars 41 slides into the third opening of the third mask, another first spacer pillar 41 can provide a support function to thereby prevent the first spacer pillar 41 sliding into the third opening from being scratched, which reduces a risk of producing fine particles, and avoids encapsulation failures or display abnormality of the display panel. The specific arrangement of the first spacer pillars 41 and the third sub-pixel openings 313 adjacent thereto is not repeated.

Figure 8:
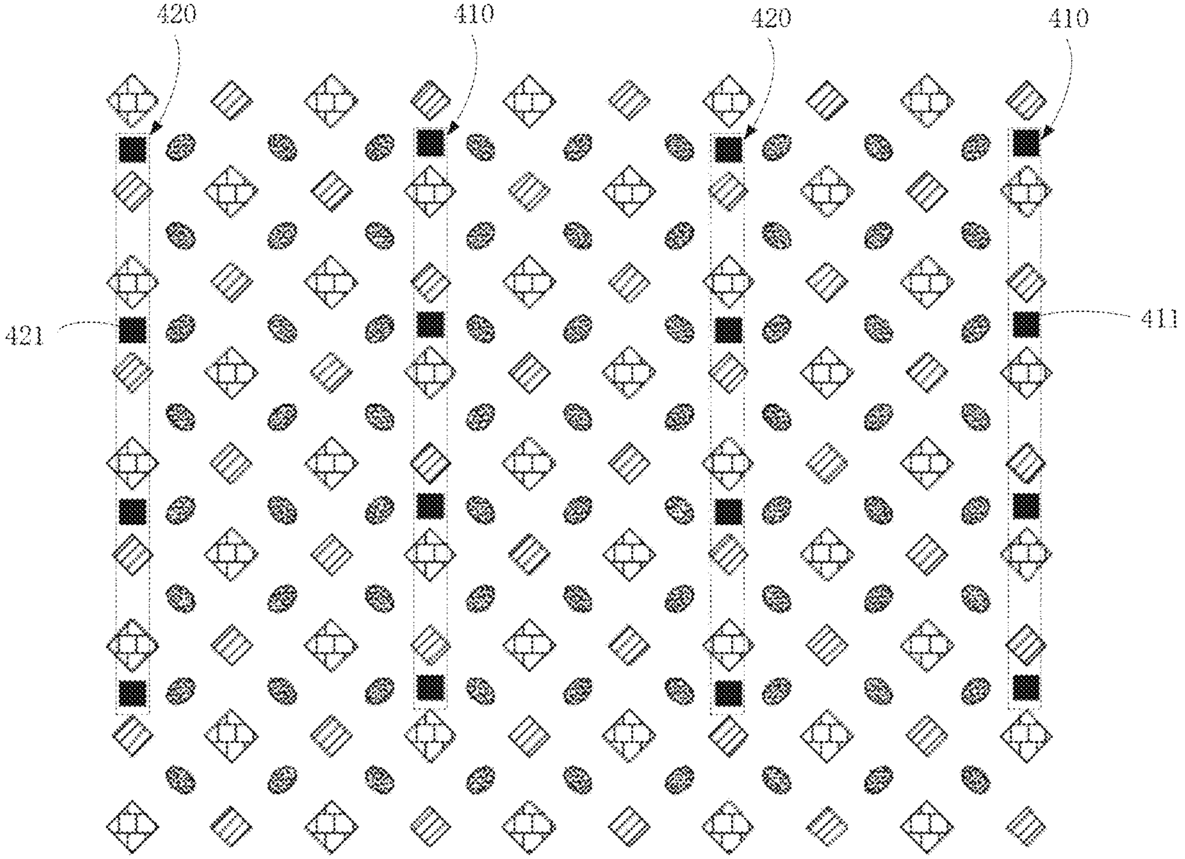
FIG. 8 is a schematic structural view illustrating the display panel according to a third embodiment of the present application.
Figure 9:
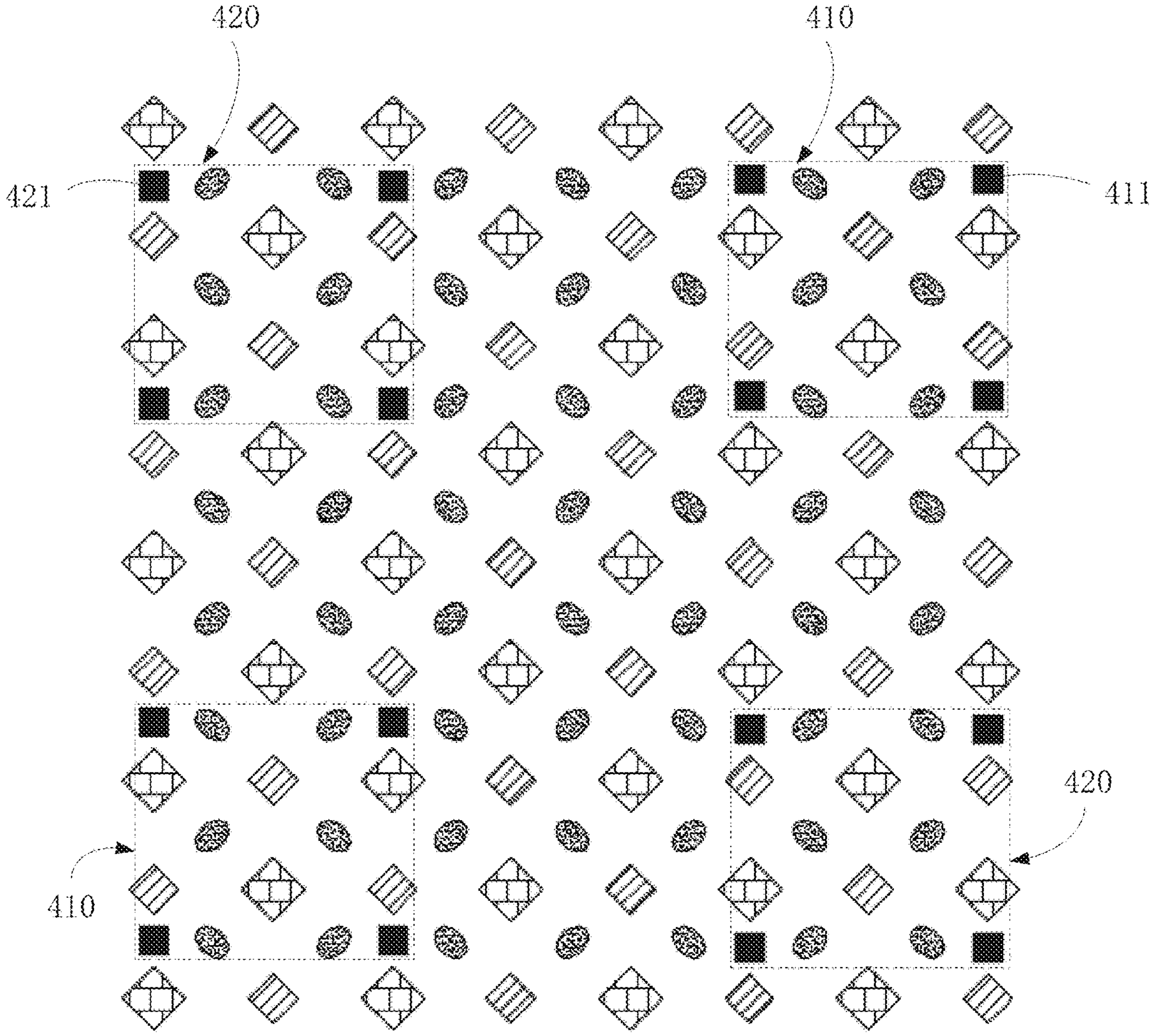
FIG. 9 is a schematic structural view illustrating the display panel according to a fourth embodiment of the present application.

In one embodiment, as shown in FIGS. 8 to 9, the first spacer pillars 41 comprise: a plurality of first spacer sets 410 and a plurality of second spacer sets 420. Each of the first spacer sets 410 comprises multiple adjacent first sub-spacers 411, and each of the second spacer sets 420 comprises multiple adjacent second sub-spacers 421. The first spacer sets 410 and the second spacer sets 420 are alternately arranged.

The first spacer sets 410 and the second spacer sets 420 are alternately arranged. Therefore, when the first sub-spacers 411 in the first spacer sets 410 slide into the openings of the mask, the second spacer sets 420 provide a more uniform support force to the mask, thus preventing the first sub-spacers 411 from having a higher risk of being scratched due to an uneven force on the mask. Similarly, the same principles are employed when the second sub-spacers 421 in the second spacer set 420 slide into the openings of the mask, and a detailed description is not repeated here.

In the present embodiment, as shown in FIG. 8, the first spacer sets 410 and the second spacer sets 420 are alternately arranged and each are arranged in a line. The first spacer sets 410 and the second spacer sets 420 are alternately arranged and each are arranged in a line. Therefore, when the first spacer pillars 411 of the first spacer set 410 slide into the openings of the mask, because the second spacer sets 420 are spaced apart from the first spacer sets 410, the second spacer sets 420 provide a more uniform support force on the mask to prevent the first sub-spacers 411 from having a higher risk of being scratched due to an uneven force on the mask. Similarly, the same principles are employed when the second sub-spacer pillars 421 in the second spacer set 420 slide into the openings of the mask, and a detailed description is not repeated here.

In the present embodiment, as shown in FIG. 9, the spacer sets comprise at least two first spacer sets 410 and at least two second spacer sets 420, and the first spacer sets 410 and the second spacer sets 420 are alternately arranged and arranged in a matrix pattern. It can be understood that the first spacer sets 410 and the second spacer sets 420 are alternately arranged and arranged in a matrix pattern, and therefore, when the sub-spacers 411 in the first spacer set 410 slide into the openings of the mask, at least two of the second spacer sets 420 are present around each of the first spacer sets 410 to support the mask. The second spacer sets 420 are staggered and distributed more evenly, ensuring that the mask is supported stably, and preventing the first sub-spacers 411 from having a higher risk of being scratched due to an uneven force on the mask. Similarly, the same principles are employed when the second sub-spacers 421 in the second spacer set 420 slide into the openings of the mask, and a detailed description is not repeated here.

It should be noted that, as shown in FIG. 3, each of the first spacer sets 410 comprises only one first sub-spacer 411, and each of the second spacer sets 420 comprises only one second sub-spacer 421. The first sub-spacers 411 and the second sub-spacers 421 are alternately arranged and are arranged in a matrix pattern. It can be understood that each of the first spacer sets 410 can comprise only one first sub-spacer 411, each of the second spacer sets 420 can comprise only one second sub-spacers 421, and the first sub-spacers 411 and the second sub-spacers 421 are alternately arranged and are arranged in a matrix pattern, so that the first sub-spacers 411 and the first sub-spacers 421 are evenly arranged to the greatest extent. That is to say, when the first sub-spacers 411 slide into the openings of the mask, at least two of the second sub-spacers 421 are present around each of the first sub-spacers 411 to support the mask, and the second sub-spacers 421 are staggered, so that the mask is supported to the greatest extent, and the mask can be supported stably to prevent the first sub-spacers 411 from having a higher risk of being scratched due to an uneven force on the mask. Similarly, the same principles are employed when the second sub-spacers 421 slide into the openings of the mask, and a description thereof is not repeated here.

Figure 10:
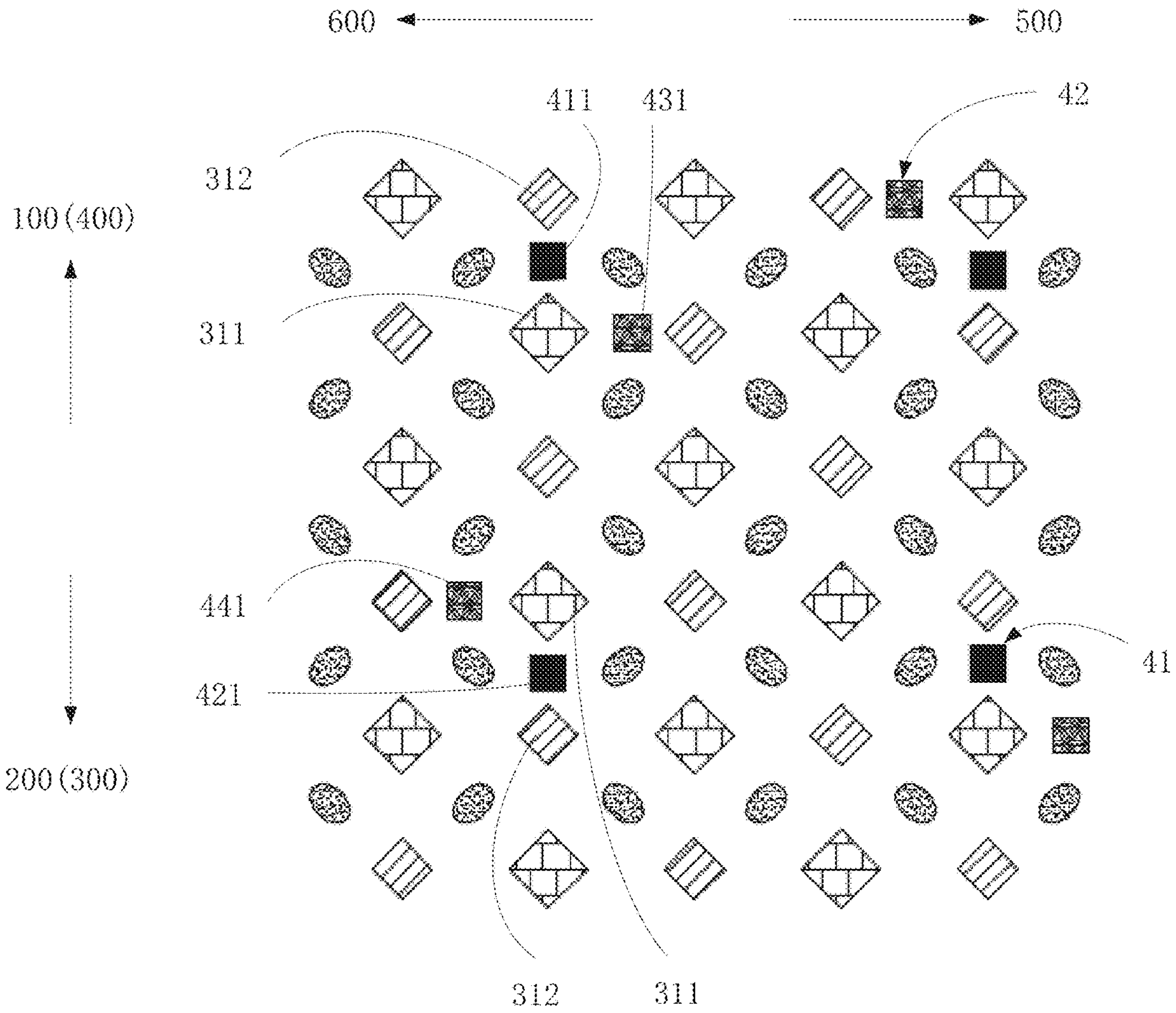
FIG. 10 is a schematic structural view illustrating the display panel according to a fifth embodiment of the present application.

In one embodiment, as shown in FIG. 10, the spacer layer 40 comprises multiple second spacer pillars 42 distributed according to a second preset rule. The second spacer pillars 42 and the first sub-pixel opening 311 adjacent thereto are arranged in one-to-one correspondence, and the second spacer pillars 42 and the first spacer pillars 41 adjacent thereto are arranged in one-to-one correspondence. The first sub-pixel openings 311 are arranged in at least two directions around the first spacer pillars 41 adjacent to the first sub-pixel openings 311, and the first sub-pixel openings 311 are arranged in at least two directions around the second spacer pillars 42 adjacent to the first sub-pixel openings 311.

The first sub-pixel openings 311 are arranged in at least two directions around the first spacer pillars 41 adjacent to the first sub-pixel openings 311, and the first sub-pixel openings 311 are arranged in at least two directions around the second spacer pillars 42 adjacent to the first sub-pixel openings 311. Therefore, when the first mask 50 is misaligned, the first spacers 41 or the second spacers 42 in at most one direction around the first sub-pixel openings 311 slide into the first openings 51 of the first mask 50, and the first spacer pillars 41 or the second spacer pillars 42 in other directions around the first sub-pixel openings 311 can well support the first mask 50. Accordingly, multi-point support is provided around the first openings 51 of the first mask 50, which greatly reduces a risk of scratching the spacer pillars sliding into the first opening 51 and prevents the spacer pillars from being scratched to produce particles. Accordingly, the present application prevents package failures or display abnormality.

It should be noted that the spacer layer 40 comprises multiple second spacer pillars 42 distributed according to the second preset rule. The second spacer pillars 42 and the first sub-pixel opening 311 adjacent thereto are arranged in one-to-one correspondence, and the second spacer pillars 42 and the first spacer pillars 41 adjacent thereto are arranged in one-to-one correspondence. In an adjacent couple of the second spacer pillars 42 and the first sub-pixel openings 311, a distance from the second spacer pillar 42 to the first sub-pixel opening 311 is less than or equal to a distance from any one of the second spacer pillars 42 to the first sub-pixel opening 311. Furthermore, under a precondition that the first sub-pixel openings 311 are arranged in at least two directions around the second spacer pillars 42, the second spacer pillars 42 are distributed according to the second preset rule, and the second spacer pillars 42 can be arranged in a regular arrangement such as a matrix, or arranged in an irregular arrangement.

In the present embodiment, as shown in FIG. 10, the second spacer pillars 42 comprise: a plurality of third sub-spacers 431 and a plurality of fourth sub-spacers 441. In an adjacent couple of the third sub-spacers 431 and the fourth sub-spacers 441, the third sub-spacer 431 is disposed at one side of the adjacent first sub-pixel opening 311 toward a fifth direction 500, the fourth sub-spacer 441 is arranged at one side of the adjacent first sub-pixel opening 311 toward a sixth direction 600, and the fifth direction 500 forms a third predetermined included angle with the sixth direction 600.

The third sub-spacer 431 is disposed at one side of the adjacent first sub-pixel opening 311 toward the fifth direction 500, the fourth sub-spacer 441 is disposed at one side of the adjacent first sub-pixel opening 311 toward the sixth direction 600, and the fifth direction 500 forms the third predetermined angle with the sixth direction 600. In other words, the third sub-spacer 431 and the fourth sub-spacer 441 are arranged along different directions around the corresponding first sub-pixel openings 311. A distance from the third sub-spacer 431 to the adjacent sub-pixel opening 311 is less than or equal to a distance from any one of the second spacer pillars 42 to the said first sub-pixel opening 311. Similarly, a distance from the fourth sub-spacer 441 to the adjacent first sub-pixel opening 311 is less than or equal to a distance from any one of the second spacer pillars 42 and the said first sub-pixel opening 311.

In the present embodiment, as shown in FIG. 10, when the first mask 50 is misaligned, the third sub-spacer 431 is disposed at one side of the adjacent first sub-pixel opening 311 toward the fifth direction 500. The fourth sub-spacer 441 is disposed at one side of the adjacent first sub-pixel opening 311 toward the sixth direction 600. The first sub-spacer 411 is disposed at one side of the adjacent first sub-pixel opening 311 toward the first direction 100, and the second sub-spacer 421 is disposed at one side of the adjacent first sub-pixel opening 311 toward the second direction 200. Only at most one group of the first sub-spacers 411, the second sub-spacers 421, the third sub-spacers 431, and the fourth sub-spacers 441 can slide into the first openings 51 of the first mask 50, and at least three groups of the first sub-spacers 411, the second sub-spacers 421, the third sub-spacers 431, and the fourth sub-spacers 441 can support the first mask 50 uniformly and stably, thereby preventing the first sub-spacers 411, the second sub-spacers 421, the third sub-spacers 431, or the fourth sub-spacers 441 from being scratched to generate particles, thus preventing encapsulation failures or display abnormality of the display panel.

In conclusion, specifically, when the first mask 50 is misaligned toward the fifth direction 500, it is easy to cause the third sub-spacers 431 to slide into the first openings 51. At this point, the fourth sub-spacers 441 can better support the first mask 50, and prevent the third sub-spacers 431 sliding into the first openings 51 from being scratched. When the first mask 50 is misaligned toward the sixth direction 600, it is easy to cause the fourth sub-spacers 441 to slide into the first openings 51. At this point, the third sub-spacers 431 can better support the first mask 50 to prevent the fourth sub-spacers 441 sliding into the first openings 51 from being scratched.

In the present embodiment, as shown in FIG. 10, in the first sub-spacer 411 and the third sub-spacer 431 both adjacent to the same first sub-pixel opening 311, a fourth predetermined included angle between the first direction 100 and the fifth direction 500 is less than 180 degrees. In the second sub-spacer 421 and the fourth sub-spacer 441 both adjacent to the same first sub-pixel opening 311, a fifth predetermined included angle between the second direction 200 and the sixth direction 600 is less than 180 degrees. Specifically, the fourth predetermined included angle and the fifth predetermined included angle are both 90 degrees.

The present application also provides a display device, and the display device comprises the display panel as described in the previous embodiment.

In the present application, multiple first spacer pillars 41 are distributed according to the first preset rule, so that the first spacer pillars 41 and the first sub-pixel openings 311 adjacent thereto are arranged in one-to-one correspondence, and the first sub-pixel openings 311 are arranged in at least two directions around the first spacer pillars 41 adjacent to the first sub-pixel openings 311. That is to say, the first spacer pillars 41 are arranged in different directions with respect to the first sub-pixel openings 311. Furthermore, the pixel openings correspond in position to the openings of the mask. As a result, when the mask is misaligned, the first spacer pillars 41 are prevented from all sliding into the openings of the mask at the same time. When one of the spacer pillars slides into the opening of the mask, another spacer pillar can provide a support function, thereby preventing the spacer pillars sliding into the openings of the mask from being scratched, thus reducing a risk of generating fine particles and preventing encapsulation failures or display abnormality of the display panel.

In summary, although the present invention has been disclosed in preferable embodiments as above, the above preferable embodiments are not intended to limit the present invention. Those of ordinary skill in the art can make various modifications without departing from the spirit and scope of the present invention, so the protection scope of the present invention is defined by the appended claims.

What is claimed is:

1. A display panel, comprising:

a thin film transistor (TFT) layer;

a pixel definition layer disposed at one side of the TFT layer, the pixel definition layer comprising a plurality of sub-pixel openings, the plurality of sub-pixel openings comprising a plurality of first sub-pixel openings arranged in rows and columns for disposing first-color sub-pixels; and a spacer layer arranged at one side of the pixel definition layer away from the TFT layer, the spacer layer comprising a plurality of first spacer pillars arranged in rows and columns and distributed according to a first preset rule:

the plurality of first spacer pillars and the plurality of first sub-pixel openings adjacent to the plurality of first spacer pillars are arranged in one-to-one correspondence, such that the plurality of first sub-pixel openings are arranged in at least two directions around the plurality of first spacer pillars adjacent to the plurality of first sub-pixel openings, wherein for any two adjacent first spacer pillars in a same row, their corresponding first sub-pixel openings are arranged on opposite sides of the row, such that the corresponding first sub-pixel openings are positioned alternately to form a periodic pattern at a first side and a second side of the row of the first spacer pillars;

wherein the plurality of first spacer pillars comprise a plurality of first sub-spacers and a plurality of second sub-spacers;

in an adjacent couple of the plurality of first sub-spacers and the plurality of second sub-spacers, the first sub-spacer is arranged at one side of an adjacent one of the plurality of first sub-pixel openings toward a first direction, the second sub-spacer is arranged at one side of an adjacent one of the plurality of first sub-pixel openings toward a second direction, and the second direction forms a first predetermined included angle with the first direction;

wherein the plurality of sub-pixel openings further comprise a plurality of second sub-pixel openings for disposing second-color sub-pixels, and the first-color sub-pixels and the second-color sub-pixels display different colors;

the plurality of first spacer pillars and the plurality of second sub-pixel openings adjacent to the plurality of first spacer pillars are arranged in one-to-one correspondence, such that the plurality of second sub-pixel openings are arranged in at least two directions around the plurality of first spacer pillars;

wherein the spacer layer further comprises a plurality of second spacer pillars distributed according to a second preset rule: the plurality of second spacer pillars and the plurality of first sub-pixel openings adjacent to the plurality of second spacer pillars are arranged in one-to-one correspondence, and the plurality of second spacer pillars and the plurality of first spacer pillars adjacent to the plurality of second spacer pillars are arranged in one-to-one correspondence, wherein the plurality of first sub-pixel openings are arranged in at least two directions around the plurality of first spacer pillars adjacent to the plurality of first sub-pixel openings, and the plurality of first sub-pixel openings are arranged in at least two directions around the plurality of second spacer pillars adjacent to the plurality of first sub-pixel openings;

wherein the plurality of second spacer pillars comprise a plurality of third sub-spacers and a plurality of fourth sub-spacers, wherein in an adjacent couple of the plurality of third sub-spacers and the plurality of fourth sub-spacers, the third sub-spacer is arranged at one side of an adjacent one of the plurality of first sub-pixel openings toward a fifth direction, the fourth sub-spacer is arranged at one side of an adjacent one of the plurality of first sub-pixel openings toward a sixth direction, and the fifth direction forms a third predetermined included angle with the sixth direction;

wherein in the first sub-spacer and the third sub-spacer adjacent to one of the same plurality of first sub-pixel openings, a fourth predetermined included angle between the first direction and the fifth direction is less than 180 degrees; and in the second sub-spacer and the fourth sub-spacer adjacent to one of the same plurality of first sub-pixel openings, a fifth predetermined included angle between the second direction and the sixth direction is less than 180 degrees;

wherein the fourth predetermined included angle and the fifth predetermined included angle are both 90 degrees.

2. The display panel according to claim 1, wherein the first predetermined included angle is 180 degrees.

3. The display panel according to claim 1, wherein the first-color sub-pixels are blue sub-pixels or red sub-pixels, and the second-color sub-pixels are blue sub-pixels or red sub-pixels.

4. The display panel according to claim 1, wherein the plurality of first spacer pillars comprise a plurality of first spacer sets and a plurality of second spacer sets; each of the first spacer sets comprises multiple adjacent ones of the first sub-spacers; each of the second spacer sets comprises multiple adjacent ones of the second sub-spacers; and the first spacer sets and the second spacer sets are alternately arranged.

5. The display panel according to claim 1, wherein in an adjacent couple of the plurality of first sub-spacers and the plurality of second sub-spacers, the first sub-spacer is disposed at one side of an adjacent one of the plurality of second sub-pixel openings toward a third direction, the second sub-spacer is arranged at one side of an adjacent one of the plurality of second sub-pixel openings toward a fourth direction, and the third direction forms a second predetermined included angle with the fourth direction.

6. The display panel according to claim 5, wherein the second predetermined included angle is 180 degrees.

7. The display panel according to claim 5, wherein each of the plurality of first spacer pillars is disposed between an adjacent one of the plurality of first sub-pixel openings and an adjacent one of the plurality of second sub-pixel openings, the first direction is opposite to the third direction, and the second direction is opposite to the fourth direction.

8. A display panel, comprising:

a thin film transistor (TFT) layer;

a pixel definition layer disposed at one side of the TFT layer, the pixel definition layer comprising a plurality of sub-pixel openings, the plurality of sub-pixel openings comprising a plurality of first sub-pixel openings arranged in rows and columns for disposing first-color sub-pixels; and a spacer layer arranged at one side of the pixel definition layer away from the TFT layer, the spacer layer comprising a plurality of first spacer pillars arranged in rows and columns and distributed according to a first preset rule:

the plurality of first spacer pillars and the plurality of first sub-pixel openings adjacent to the plurality of first spacer pillars are arranged in one-to-one correspondence, such that the plurality of first sub-pixel openings are arranged in at least two directions around the plurality of first spacer pillars adjacent to the plurality of first sub-pixel openings;

wherein the plurality of first spacer pillars comprise a plurality of first sub-spacers and a plurality of second sub-spacers;

in an adjacent couple of the plurality of first sub-spacers and the plurality of second sub-spacers, the first sub-spacer is arranged at one side of an adjacent one of the plurality of first sub-pixel openings toward a first direction, the second sub-spacer is arranged at one side of an adjacent one of the plurality of first sub-pixel openings toward a second direction, and the second direction forms a first predetermined included angle with the first direction;

wherein the plurality of sub-pixel openings further comprise a plurality of second sub-pixel openings for disposing second-color sub-pixels, and the first-color sub-pixels and the second-color sub-pixels display different colors;

the plurality of first spacer pillars and the plurality of second sub-pixel openings adjacent to the plurality of first spacer pillars are arranged in one-to-one correspondence, such that the plurality of second sub-pixel openings are arranged in at least two directions around the plurality of first spacer pillars;

wherein the spacer layer further comprises a plurality of second spacer pillars distributed according to a second preset rule: the plurality of second spacer pillars and the first sub-pixel openings adjacent to the second spacer pillars are arranged in one-to-one correspondence, and the plurality of second spacer pillars and the first spacer pillars adjacent to the plurality of second spacer pillars are arranged in one-to-one correspondence, wherein the plurality of first sub-pixel openings are arranged in at least two directions around the plurality of first spacer pillars adjacent to the plurality of first sub-pixel openings, and the plurality of first sub-pixel openings are arranged in at least two directions around the plurality of second spacer pillars adjacent to the plurality of first sub-pixel openings;

wherein the plurality of first spacer pillars comprise a plurality of first spacer sets and a plurality of second spacer sets; each of the plurality of first spacer sets comprises multiple adjacent ones of the first sub-spacers; each of the plurality of second spacer sets comprises multiple adjacent ones of the second sub-spacers; and the plurality of first spacer sets and the plurality of second spacer sets are alternately arranged along a row direction to form a periodic pattern, such that a group of the first sub-spacers oriented toward the first direction is followed by a group of the second sub-spacers oriented toward the second direction.

9. The display panel according to claim 8, wherein the first-color sub-pixels are blue sub-pixels or red sub-pixels, and the second-color sub-pixels are blue sub-pixels or red sub-pixels.

10. The display panel according to claim 8, wherein the plurality of second spacer pillars comprise a plurality of third sub-spacers and a plurality of fourth sub-spacers, wherein in an adjacent couple of the plurality of third sub-spacers and the plurality of fourth sub-spacers, the third sub-spacer is arranged at one side of an adjacent one of the plurality of first sub-pixel openings toward a fifth direction, the fourth sub-spacer is arranged at one side of an adjacent one of the plurality of first sub-pixel openings toward a sixth direction, and the fifth direction forms a third predetermined included angle with the sixth direction.

11. The display panel according to claim 8, wherein in an adjacent couple of the plurality of first sub-spacers and the plurality of second sub-spacers, the first sub-spacer is disposed at one side of an adjacent one of the plurality of second sub-pixel openings toward a third direction, the second sub-spacer is arranged at one side of an adjacent one of the plurality of second sub-pixel openings toward a fourth direction, and the third direction forms a second predetermined included angle with the fourth direction.

12. The display panel according to claim 11, wherein each of the plurality of first spacer pillars is disposed between an adjacent one of the plurality of first sub-pixel openings and an adjacent one of the plurality of second sub-pixel openings, the first direction is opposite to the third direction, and the second direction is opposite to the fourth direction.

* * * * *